US012006457B2

(12) United States Patent
Jeon et al.

(10) Patent No.: US 12,006,457 B2
(45) Date of Patent: Jun. 11, 2024

(54) GRAPHENE QUANTUM DOT COMPOSITE WITH DIELECTRIC MATRIX, ELECTROLUMINESCENT DEVICE HAVING THE SAME, AND METHOD FOR MANUFACTURING THE GRAPHENE QUANTUM DOT COMPOSITE

(71) Applicant: Korea Advanced Institute of Science and Technology, Daejeon (KR)

(72) Inventors: Seokwoo Jeon, Daejeon (KR); Minsu Park, Daejeon (KR); Hyewon Yoon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 456 days.

(21) Appl. No.: 17/290,795

(22) PCT Filed: Oct. 31, 2019

(86) PCT No.: PCT/KR2019/014548
§ 371 (c)(1),
(2) Date: May 3, 2021

(87) PCT Pub. No.: WO2020/130325
PCT Pub. Date: Jun. 25, 2020

(65) Prior Publication Data
US 2021/0403804 A1 Dec. 30, 2021

(30) Foreign Application Priority Data

Dec. 20, 2018 (KR) .................. 10-2018-0166185

(51) Int. Cl.
*C09K 11/02* (2006.01)
*C09K 11/65* (2006.01)
(Continued)

(52) U.S. Cl.
CPC .............. *C09K 11/02* (2013.01); *C09K 11/65* (2013.01); *H10K 50/115* (2023.02); *B82Y 20/00* (2013.01); *B82Y 40/00* (2013.01)

(58) Field of Classification Search
CPC ...... C09K 11/02; C09K 11/65; H10K 50/115; B82Y 20/00; B82Y 40/00; H05B 33/14; H05B 33/20
See application file for complete search history.

(56) References Cited

U.S. PATENT DOCUMENTS

2021/0403804 A1* 12/2021 Jeon ................. H05B 33/20

FOREIGN PATENT DOCUMENTS

| CN | 108258100 A | * | 7/2018 | ........... H01L 33/005 |
| EP | 3144980 A1 | * | 3/2017 | ....... H01L 27/14645 |

(Continued)

OTHER PUBLICATIONS

Park, Minsu et al. Efficient Solid-State Photoluminescence of Graphene Quantum Dots Embedded in Boron Oxynitride for AC-Electroluminescent Device. Advanced Materials. Aug. 7, 2018, vol. 30, 1802951, pp. 1-8 (Year: 2018).*

(Continued)

*Primary Examiner* — Ermias T Woldegeorgis
(74) *Attorney, Agent, or Firm* — DALY, CROWLEY, MOFFORD & DURKEE, LLP

(57) ABSTRACT

The disclosed graphene quantum dot composite includes a dielectric matrix including a metal oxynitride, and a graphene quantum dot dispersed in the dielectric matrix. The graphene quantum dot composite can reduce the aggregation-caused photoluminescence quenching of graphene quantum dots, and can improve a photoluminescence quantum yields of a graphene quantum dot.

16 Claims, 8 Drawing Sheets

(51) Int. Cl.
*H10K 50/115* (2023.01)
*B82Y 20/00* (2011.01)
*B82Y 40/00* (2011.01)

(56) References Cited

FOREIGN PATENT DOCUMENTS

| KR | 10-2013-0091381 A | 8/2013 |
| KR | 10-2017-0012345 A | 2/2017 |

OTHER PUBLICATIONS

Happich, "Graphene QDs Yield Bright Blue AC-Electroluminescence;" Article from eeNews https://www.eenewsautomotive.com/news/graphene-gds-yield-bright-blue-ac-electroluminescence; Oct. 22, 2018; 1 Pages.

Li et al., "Graphene Quantum Dots Embedded in Hexagonal Boron Nitride Sheets;" Article from Applied Physics Letters, vol. 98, 013105; Published Jan. 5, 2011; 4 Pages.

Park et al., "Efficient Solid-State Photoluminescence of Graphene Quantum Dots Embedded in Boron Oxynitride for AC-Electroluminescent Device;" Article from Advanced Materials; Aug. 7, 2018; 8 Pages.

Tabassum et al., "Hierarchical Cobalt Hydroxide and B/N Co-Doped Graphene Nanohybrids Derived from Metal-Organic Frameworks for High Energy Density Asymmetric Supercapacitors;" Article from Scientific Reports; Published Feb. 27, 2017; 12 Pages.

PCT International Search Report (with English Translation) dated Feb. 6, 2020 for PCT International Application No. PCT/KR2019/014548; 4 Pages.

Korean Notice of Allowance (with Machine English Translation from Espacenet.com) dated Aug. 24, 2020 for Korean Application No. 10-2018-0166185; 3 Pages.

\* cited by examiner

LIGHT

LIGHT

GRAPHENE QUANTUM DOT COMPOSITE WITH DIELECTRIC MATRIX, ELECTROLUMINESCENT DEVICE HAVING THE SAME, AND METHOD FOR MANUFACTURING THE GRAPHENE QUANTUM DOT COMPOSITE

CROSS REFERENCE TO RELATED APPLICATIONS

This application is a U.S. National Stage Application of International Application No. PCT/KR2019/014548 filed on Oct. 31, 2019 which is based upon and claims the benefit of priority to Korean Patent Application No. 10-2018-0166185 filed on Dec. 20, 2018 in the Korean Intellectual Property Office. The disclosures of the above-listed applications are hereby incorporated by reference herein in their entirety.

TECHNICAL FIELD

The invention relates to a graphene quantum dot composite. More particularly, the invention relates to a graphene quantum dot composite with a dielectric matrix, an electroluminescent device including the same and a method for manufacturing the graphene quantum dot composite.

BACKGROUND

Graphene quantum dots (GQDs) are graphene derivatives having a size of several to tens of nanometers, and have unique luminescence characteristics due to a band gap according to various manufacturing methods such as top-down, bottom-up, and so on. Because of having high resistance to photobleaching and high biocompatibility as well as broad spectrum covering from ultraviolet (UV) to a visible light, GQDs have high potential for use in next-generation flexible displays and illumination industries by replacing conventional toxic heavy metal-based semiconductor quantum dots.

Recently, studies on the fabrication of light-emitting devices for implementing electroluminescence (EL) based on GQDs have been actively conducted. Existing applications of GQDs for EL devices have mainly focused on organic light-emitting diodes (OLEDs) that are driven at a low turn-on voltage by an efficient carrier injection.

For example, Non-Patent Literature 1 reports an OLEDs device using blue-emitting GQDs.

For example, Non-Patent Literature 2 reports an another OLEDs device using GQDs having red, orange, and green luminescent characteristics by adjusting a band gap through surface-functionalization.

For example, Non-Patent Literature 3 describes an EL mechanism in an EL device, in which graphene oxide quantum dots (GOQDs) are used in an emission layer of OLEDs.

However, a performance of an OLEDs device with an emission layer consists of GQDs and host material was unsatisfactory compared to conventional OLEDs or semiconductor quantum dots LEDs (QLEDs). The low performance of the GQDs-based EL device might be due to self-quenching and/or photon re-absorption of excited electrons that occur in the aggregated GQDs. Particularly, due to the van der Waals interaction of it-conjugated electrons on a graphene basal plane, restacking between adjacent GQDs may easily occur, thereby resulting in significant aggregation of GQDs. This may hinder an uniform thin film formation, and inhibits carrier transport to the emission layer and also radiative recombination.

Furthermore, a relatively low photoluminescence quantum yield (PLQY) of inherent GQDs might be a challenge for EL devices. Although the PLQY of the GQDs may differ depending on synthesis methods, surface treatments, and solvent, normally, it has significantly lower value (2-20%) than that of organic light-emitting materials or semiconductor quantum dots (80-90%). The PL quenching due to the aggregation of the GQDs may further deteriorate a performance of the EL devices.

In order to prevent aggregation of GQDs, using a polymer such as poly(vinyl alcohol) (PVA) (Patent Literature 1) or using a matrix material such as cellulose nanofiber (Non-Patent Literature 4) for improving internal dispersibility have been reported. However, even with the use of these materials, the PLQY of GQDs are still low (~12%), and the application by using them is limited to a color conversion film for down-converting white-light emission. Furthermore, a thick polymeric layer surrounding the GQDs would disturb an efficient carrier injection.

PRIOR REFERENCES

Patent Literature (1) Korean Patent Publication No. 10-2017-0012345

Non-Patent Literature (1) Adv. Opt. Mater. 2014, 2, 11, 1016-1023
(2) Sci. Rep. 2015, 5, 11032
(3) Sci. Rep. 2016, 6, 24205
(4) J. Mater. Chem. C 2015, 3, 3536

DETAILED DESCRIPTION OF THE INVENTION

Technical Problem to be Solved

One objective of the invention is to provide a graphene quantum dot composite, including a dielectric matrix that can prevent quenching, and increase photoluminescence quantum yields.

Another objective of the invention is to provide a method of manufacturing the graphene quantum dot composite.

Another objective of the invention is to provide an electroluminescent device including the graphene quantum dot composite.

The invention may, however, be embodied in many different forms and should not be construed as limited to the embodiments set forth herein.

Means for Solving Problem

According to an embodiment to accomplish the objectives of the present invention, a graphene quantum dot composite includes a dielectric matrix including a metal oxynitride, and a graphene quantum dot dispersed in the dielectric matrix.

A method for manufacturing a graphene quantum dot composite according to an embodiment of the invention includes preparing a mixture solution including a graphene quantum dot, a nitrogen-containing hydride and a metal hydroxide, and reacting the nitrogen-containing hydride and the metal hydroxide with each other to form a dielectric matrix including a metal oxynitride and dispersing the graphene quantum dot therein.

An electroluminescent device according to an embodiment of the invention includes a lower electrode, an upper electrode spaced apart from the lower electrode, and a light-emitting layer disposed between the lower electrode and the upper electrode and including a graphene quantum dot composite.

Effects of the Invention

According to the above-explained embodiments of the present invention, a quenching effect due to aggregation of graphene quantum dots may be inhibited, and a quantum efficiency of a graphene quantum dot may be increased. Furthermore, stability may be achieved so that a graphene quantum dot composite may be used for a light-emitting material for a high electric field electroluminescent device.

BEST EMBODIMENT FOR IMPLEMENTING THE INVENTION

Figure 1:
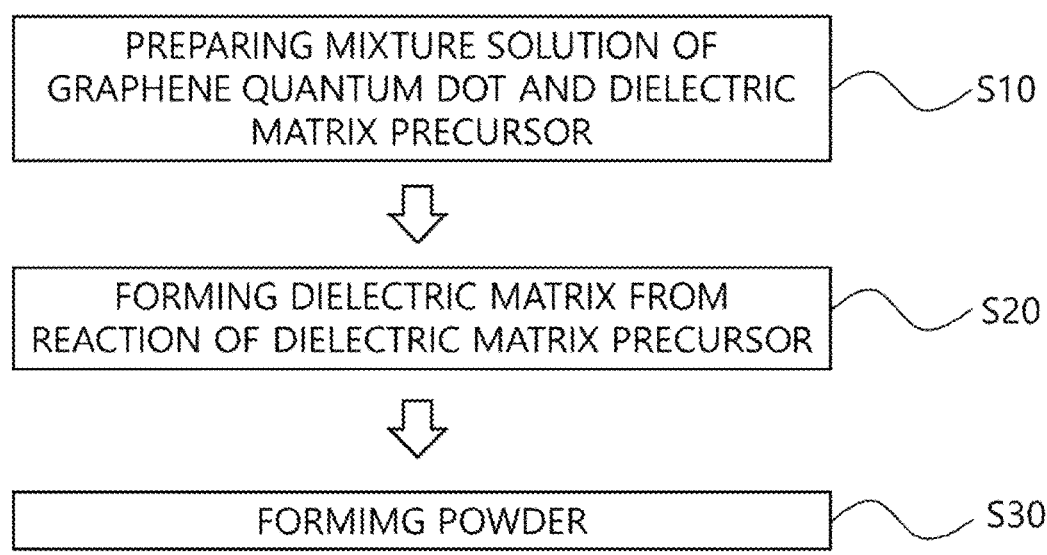
FIG. 1 is a flowchart illustrating a method for manufacturing a graphene quantum dot composite according to an embodiment of the present invention.

A graphene quantum dot composite including a dielectric matrix, an electroluminescent device including the graphene quantum dot composite and a method for manufacturing the graphene quantum dot composite according to embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Graphene Quantum Dot Composite and Method for Manufacturing the Same

Figure 2:
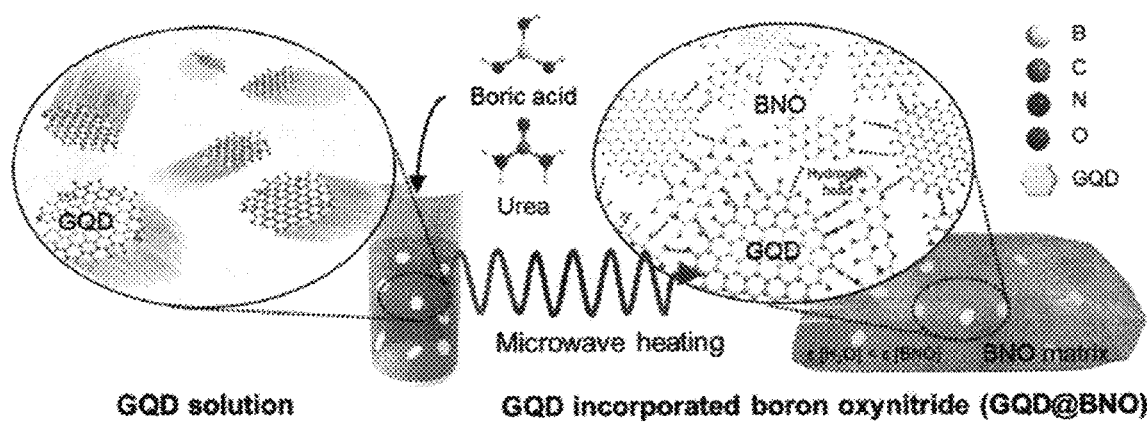
FIG. 2 is a schematic view illustrating a method for manufacturing a graphene quantum dot composite according to an embodiment of the present invention.

FIG. 1 is a flowchart illustrating a method for manufacturing a graphene quantum dot composite according to an embodiment of the present invention. FIG. 2 is a schematic view illustrating a method for manufacturing a graphene quantum dot composite according to an embodiment of the present invention.

Referring to FIGS. 1 and 2, a graphene quantum dot (GQD) solution including a graphene quantum dot dispersed therein is prepared.

In an embodiment, the graphene quantum dot may be obtained from graphene oxide.

For example, the graphene quantum dot may be obtained by mixing and heating graphite and a metal salt hydrate to form a graphite intercalation compound and removing an intercalated metal ion from the graphite intercalation compound.

In an embodiment, the metal salt hydrate may include a hydrate of an alkali metal salt or an alkali earth metal salt.

For example, the alkali metal salt or the alkali earth metal salt may include an organic carboxylate, an alkoxylate, an oxalate, a phenoxylate, an organic sulfonate, an organic phosphate, a sulfonate, a phosphate, a carbonate, a halogenate, a nitrate or a combination, of an alkali metal or an alkali earth metal.

Furthermore, when the alkali metal salt or the alkali earth metal salt is selected from an organic carboxylate, an alkoxylate, a phenoxylate, an organic sulfonate, an organic phosphate and combination thereof, the alkali metal salt or the alkali earth metal salt may include at least one functional group selected from an aliphatic hydrocarbon chain, an aromatic hydrocarbon ring and an aromatic heterocyclic ring.

More particularly, the metal salt hydrate may include at least one of sodium acetate trihydrate ($NaC_2H_3CO_2 \cdot 3H_2O$), sodium carbonate heptahydrate ($Na_2CO_3 \cdot 7H_2O$), sodium citrate pentahydrate ($Na_3C_6H_5O_7 \cdot 5H_2O$), sodium orthophosphate dodecahydrate ($Na_3PO_4 \cdot 12H_2O$), magnesium and sodium tartrate decahydrate ($Na_2Mg(C_4H_4O_6)_2 \cdot 10H_2O$), sodium sulfate decahydrate ($Na_2SO_4 \cdot 10H_2O$), and magnesium sulfate hexahydrate ($K_2Mg(SO_4)_2 \cdot 6H_2O$), calcium acetate dehydrate ($Ca(C_2H_3O_2)_2 \cdot 2H_2O$), calcium carbonatehexahydrate ($CaCO_3 \cdot 6H_2O$), calcium chloride hexahydrate ($CaCl_2 \cdot 6H_2O$), calcium citrate tetrahydrate ($Ca_3[O_2CCH_2C(OH)(CO_2)CH_2CO_2]_2 \cdot 4H_2O$), calcium lactate pentahydrate ($Ca(C_3H_5O_3)_2 \cdot 5H_2O$), calcium nitrate trihydrate ($Ca(NO_3)_2 \cdot 3H_2O$), calcium sulfate dehydrate ($CaSO_4 \cdot 2H_2O$), magnesium acetate tetrahydrate ($Mg(C_2H_3O_2)_2 \cdot 4H_2O$), magnesium carbonate pentahydrate ($MgCO_3 \cdot 5H_2O$), magnesium acetate trihydrate ($Mg(C_3H_5O_2)_2 \cdot 3H_2O$), magnesium nitrate hexahydrate ($Mg(NO_3)_2 \cdot 6H_2O$)), magnesium orthophosphate octahydrate ($Mg_3(PO_4)_2 \cdot 8H_2O$), magnesium sulfate heptahydrate ($MgSO_4 \cdot 7H_2O$), magnesium tartrate pentahydrate ($MgC_4H_4O_6 \cdot 5H_2O$) and sodium carbonate decahydrate ($Na_2CO_3 \cdot 10H_2O$).

The graphite and the metal salt hydrate, which are mixed with each other, may be heated to be uniformly melted. For example, the graphite and the metal salt hydrate may be heated at 100 to 400° C., and may be preferably heated at 150 to 300° C.

For example, a weight ratio of the graphite to the metal salt hydrate may be 1:1~1:10, and may be preferably 1:1~1:5.

In an embodiment, the graphite intercalation compound may be dispersed in a solvent capable of dissolving a metal ion to remove the intercalated metal ion from the graphite intercalation compound.

For example, the solvent may include water, ethanol, methanol, isopropanol, formamide, dimethyl sulfoxide, dimethylformamide, acetic acid, acetonitrile, methoxy ethanol, tetrahydrofuran, benzene, xylene, toluene, cyclohexane or a combination thereof.

When the metal ion is dissolved by the solvent, the graphite intercalation compound may be split into a plurality of thin layers so that a graphene quantum dot may be obtained.

An ultrasonication process may be further performed to increase solubility of the graphene quantum dot and the metal ion.

The graphene quantum dot may be re-dispersed in a solvent, as desired. A size of the graphene quantum dot may be varied depending on a dispersion solvent thereby adjusting a band gap of the graphene quantum dot.

The dispersion solvent may include water, ethanol, methanol, isopropanol, formamide, dimethyl sulfoxide, dimethylformamide, acetic acid, acetonitrile, methoxy ethanol, tetrahydrofuran, benzene, xylene, toluene, cyclohexane or a combination thereof.

For example, the graphene quantum dot may have a diameter of 1 nm to 50 nm. In an embodiment, the graphene quantum dot may have a two-dimensional flake shape, and may have a carbonyl group (C=O) or a hydroxyl group (—OH).

Thereafter, the graphene quantum dot solution may be mixed with a dielectric matrix precursor to prepare a mixture solution including the graphene quantum dot and the dielectric matrix precursor (S10).

In an embodiment, the dielectric matrix precursor may include a nitrogen-containing hydride and a metal hydroxide.

In an embodiment, the nitrogen-containing hydride may have at least one bond of C=O, C=S, C=Se and C=N.

For example, the nitrogen-containing hydride may include hydrogen cyanide, sodium cyanide, potassium cyanide, calcium cyanide, mercury cyanide, sodium nitroprussiate, acetonitrile, cyanogen chloride, cyanogen bromide, cyanogen fluoride, carbonyldiamine, carbonyldiimidazole, carbamoyl phosphate, cyanamide, sodium dicyanamide, malononitrile, valeronitrile, methyl isocyanate, methyl cyanoacrylate, methyl ferrocyanide, ethyl isocyanate, ethyl cyanoacrylate, ethyl ferrocyanide, propyl isocyanate, propyl cyanoacrylate, propyl ferrocyanide, butyl isocyanate, butyl cyanoacrylate, butyl ferrocyanide, pentyl isocyanate, pentyl cyanoacrylate, pentyl ferrocyanide, hexyl isocyanate, hexyl cyanoacrylate, hexyl ferrocyanide, butyl cyanoacetate, allyl cyanoacetate, 3-aminocrotononitrile, 2-methylbutyronitrile, 2-methoxyethyl cyanoacetate, thiosemicarbazide, dithiooxamide, thioacetamide, ethyl thiooxamate, 2-methyl-3-thiosemicarbazide, 4-methyl-3-thiosemicarbazide, 2-cyanothioacetamide, 4,4-dimethyl-3-thiosemicarbazide, 4-ethyl-3-thiosemicarbazide, 2-bromothiobenzamide, 3-bromothiobenzamide, 4-bromothiobenzamide, 4-chlorothiobenzamide, thiobenzamide, 4-methylbenzenethioamide, selenourea, selenoformamide, selenoacetamide, selenobenzamide, urea or a combination thereof.

In an embodiment, the metal hydroxide may contain an alkali metal, an alkali earth metal, a transition metal, a post transition metal, a metalloid or a combination thereof. For example, the metal hydroxide may include a trivalent metal hydroxide such as boron hydroxide, aluminum hydroxide, gold hydroxide, gallium hydroxide, yttrium hydroxide, indium hydroxide, scandium hydroxide, cobalt hydroxide, iridium hydroxide, ruthenium hydroxide, chromium hydroxide, iron hydroxide or the like, a quadvalent metal hydroxide such as zirconium hydroxide, titanium hydroxide, hafnium hydroxide, silicon hydroxide, tungsten hydroxide, cerium hydroxide, osmium hydroxide or the like, a pentavalent metal hydroxide such as vanadium hydroxide, niobium hydroxide, tantalum hydroxide or the like, a hexavalent metal hydroxide such as molybdenum hydroxide or the like, or a combination thereof.

In an embodiment, the nitrogen-containing hydride may include urea (($NH_3$)$_2$CO). The metal hydroxide may include boric acid (boron hydroxide, $H_3BO_3$).

In an embodiment, the mixture solution may be preheated at 50° C. to 60° C. to accelerate dissolution of the nitrogen-containing hydride and the metal hydroxide.

Furthermore, methods such as stirring, magnetic stirring, ultra-sonication, shaking, vortexing or the like may be performed to uniformly mix the dielectric matrix precursor and the graphene quantum dot with each other.

Thereafter, the nitrogen-containing hydride and the metal hydroxide react with each other to form a dielectric matrix (S20). For example, the nitrogen-containing compound and the metal hydroxide may form the dielectric matrix through cross-linking reaction.

In an embodiment, an electromagnetic wave such as a microwave may be provided to heat the mixture solution. Accordingly, the nitrogen-containing hydride may be decomposed to react with a metal component of the metal hydroxide thereby forming a nitrogen-metal bond. Thus, the dielectric matrix may include a metal oxynitride.

For example, the metal oxynitride may include oxynitride of boron, aluminum, gold, gallium, yttrium, indium, scandium, cobalt, iridium, ruthenium, chromium, iron, zirconium, titanium, hafnium, silicon, tungsten, cerium, osmium, vanadium, niobium, tantalum or molybdenum, or a combination thereof.

For example, when the nitrogen-containing hydride is urea, the urea may be decomposed by heat to form a B—N bond. Thus, boron oxynitride (BNO) may be formed. In an embodiment, boron oxynitride may be an intermediate between turbostratic boron nitride (t-BN) and boric oxide (BOx). Furthermore, the dielectric matrix may further include carbon and hydrogen, which are provided from the precursor.

When the dielectric matrix is formed, a hydrogen bond may be formed between a carbonyl group of the graphene quantum dot and a hydroxyl group of the BNO matrix or between a carbonyl group of the graphene quantum dot and a hydroxyl group of the boric acid. Thus, when the dielectric matrix is formed, π-π interaction between graphene quantum dots can be inhibited so that aggregation of the graphene quantum dots may be prevented to maintain dispersion. Furthermore, when a microwave is used, reaction of the dielectric matrix precursor may be accelerated. Thus, aggregation of the graphene quantum dots may be further inhibited.

Heat treatment for heating the dielectric matrix precursor is not limited to using an electromagnetic wave, and thermal heating, vacuum heating, drying or the like may be used. For example, the heat treatment may be performed at 400° C. or less. The solvent may be removed in the heat treatment.

In an embodiment, a composite of boron oxynitride matrix with a graphene quantum dot dispersed therein (GQD@BNO) may be obtained.

As explained in the above, in the process of forming the composite, a distancing gap between graphene quantum dots may be maintained. Thus, a quenching effect due to aggregation of graphene quantum dots may be inhibited.

Thereafter, a powder of the graphene quantum dot composite may be formed (S30).

The graphene quantum dot composite formed from reaction of the dielectric matrix precursor may have a bulk form or may have an irregular size. Thus, it may be preferable to form a powder through milling or the like so that the graphene quantum dot composite may have a proper dimension for target application.

For example, the graphene quantum dot composite may be grinded by a dry method or a wet method. In an embodiment, a ball-milling process may be used for grinding the graphene quantum dot composite. The ball-milling process may provide a high energy, while the graphene quantum dot composite is grinded, so that characteristics of the dielectric matrix may be improved. Furthermore, a powder size may be easily adjusted by changing a process condition (e.g. the number of revolution). For example, the ball-milling process may be performed with a rotation speed of 500~2,000 rpm for 5~30 minutes.

For example, a diameter of the graphene quantum dot powder may be 100 μm or less. Preferably, a diameter of the graphene quantum dot powder may be 30 μm or less. More preferably, a diameter of the graphene quantum dot powder may be 20 μm or less. When a diameter of the graphene quantum dot powder is excessively large, a PLQY may be decreased.

A content of the graphene quantum dot in the composite may be adjusted in view of the suppression degree of aggregation, and the enhancement ratio of a PLQY. For example, a content of the graphene quantum dot in the composite may be 0.001 wt % to 10 wt %.

Preferably, a content of the graphene quantum dot in the composite may be 0.01 wt % to 1 wt %. More preferably, a content of the graphene quantum dot in the composite may be 0.01 wt % to 0.1 wt %. When a content of the graphene quantum dot is excessively large, a quenching effect may be caused again, and a PLQY may be decreased. When a content of the graphene quantum dot is excessively small, a PLQY may be decreased. For example, a content of the graphene quantum dot in the composite may be 0.01 wt % to 0.07 wt %.

A distance between graphene quantum dots in the composite may be adjusted depending on a content of the graphene quantum dot and a material of the dielectric matrix. Preferably, a distance between graphene quantum dots in the composite may be 4 nm or more.

Furthermore, a material constituting the dielectric matrix may have a band gap, and may have a refractivity (refractive index of BNO: 1.6~1.8) and a permittivity greater those of a polymer. Thus, a PLQY of the graphene quantum dot may be increased.

The graphene quantum dot composite can be used for various electronic devices such as an electroluminescent device, an illumination device, a flexible display, and so on. Furthermore, the graphene quantum dot composite can also be used for a color-converting film to change wavelength of a light generated by an excitation source.

Electroluminescent Device

Figure 3A:
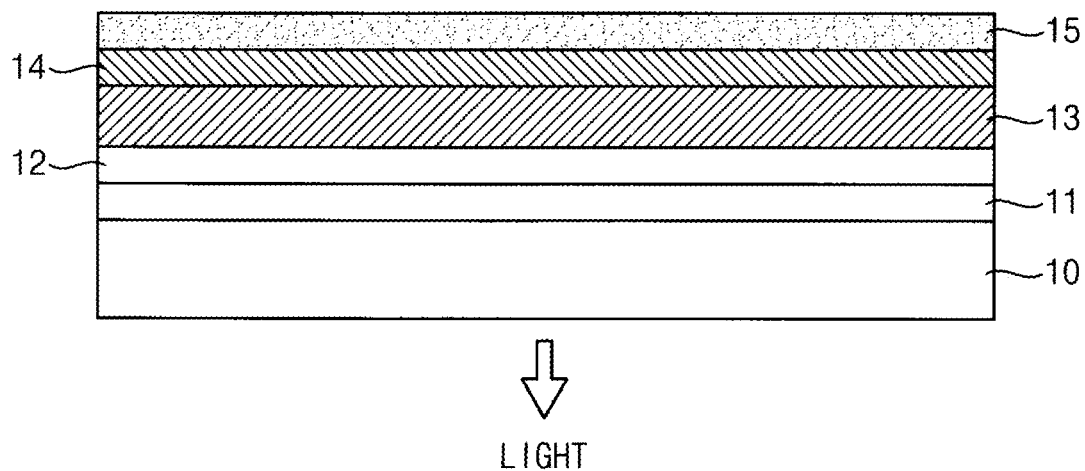
FIG. 3A is a cross-sectional view illustrating an electroluminescent device according to an embodiment of the present invention.

FIG. 3A is a cross-sectional view illustrating an electroluminescent device according to an embodiment of the present invention.

In an embodiment, an electroluminescent device includes a base substrate 10, a lower electrode 11 disposed on the base substrate 10, a lower dielectric layer 12 disposed on the lower electrode 11, a light-emitting layer 13 disposed on the lower dielectric layer 12, an upper dielectric layer 14 disposed on the light-emitting layer 13, and an upper electrode 15 disposed on the upper dielectric layer 14.

For example, the base substrate 10 may be a transparent substrate including glass, quartz, plastic material or the like.

In an embodiment, the lower electrode 11 may include a transparent conductive material. For example, the lower electrode 11 may include indium oxide, zinc oxide, tin oxide, indium zinc oxide, indium tin oxide or the like. Furthermore, the lower electrode 11 may include a conductive polymer such as polyaniline, polythiophene, polypyrrole or the like.

The lower dielectric layer 12 may include a dielectric material with a high transparency, for example, cyanoated cellulose resin such as cyanoethyl cellulose resin, cyanoated pullulan resin such as cyanoethyl pullulan resin, vinylidene fluoride rubber, vinylidene fluoride copolymer rubber resin, cyanoated polyvinyl alcohol or a combination thereof. The lower dielectric layer 12 may be omitted as desired.

The light-emitting layer 13 includes a graphene quantum dot composite. The graphene quantum dot composite may include a graphene quantum dot inserted in a dielectric matrix. The graphene quantum dot composite is same as that previously explained in the above. Thus, further explanation will be omitted.

In an embodiment, the light-emitting layer 13 may further include a binder resin. For example, a paste including the binder resin, a powder of the graphene quantum dot composite and a solvent may be coated on the lower dielectric layer 12, and the solvent may be removed by drying or the like to form the light-emitting layer 13.

In an embodiment, the light-emitting layer 13 may further include another inorganic quantum dot, another inorganic fluorescent substance or the like in addition to the graphene quantum dot.

In an embodiment, a content of the graphene quantum dot composite in the light-emitting layer 13 may be 10 wt % to 90 wt %. Furthermore, the light-emitting layer 13 may be configured to emit a blue electroluminescence.

The binder resin may preferably include a binder having a relatively high permittivity, which is suitable for an electroluminescent device. For example, the binder resin may include cyanoated cellulose resin, cyanoated pullulan resin, vinylidene fluoride rubber, vinylidene fluoride copolymer rubber, cyanoated polyvinyl alcohol or a combination thereof.

In an embodiment, the upper dielectric layer 14 may include a ferroelectric material having a high dielectric constant such as barium titanate ($BaTiO_3$). The upper dielectric layer 14 including a ferroelectric material may increase an intensity of an electric field applied to the light-emitting layer 13 thereby increasing a PLQY. The upper dielectric layer 14 may be omitted as desired.

In an embodiment, the upper electrode 15 may include a metal, for example, nickel (Ni), platinum (Pt), gold (Au), silver (Ag), iridium (Ir), aluminum (Al) or a combination thereof.

An electroluminescent device according to an embodiment of the present invention includes a composite of a graphene quantum dot embedded in a dielectric matrix. A distancing gap between adjacent graphene quantum dots in the composite may be maintained so that a quenching effect should be inhibited. Because the composite includes the dielectric matrix, the composite may be effectively used for an AC power electroluminescent device (ACPEL) generating a high electric field.

Figure 3B:
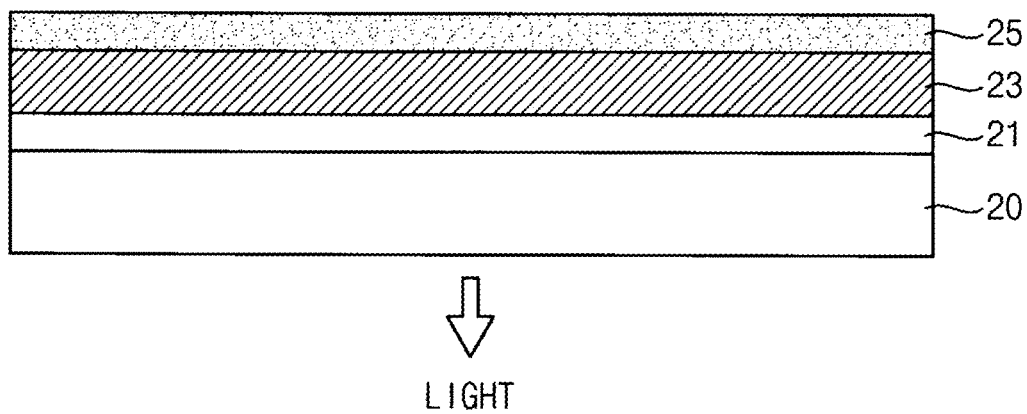
FIG. 3B is a cross-sectional view illustrating an electroluminescent device according to an embodiment of the present invention.

FIG. 3B is a cross-sectional view illustrating an electroluminescent device according to an embodiment of the present invention.

In an embodiment, an electroluminescent device includes a base substrate 20, a lower electrode 21 disposed on the base substrate 20, a light-emitting layer 23 disposed on the lower electrode 21, and an upper electrode 25 disposed on the light-emitting layer 23. The light-emitting layer 23 includes a composite of a graphene quantum dot embedded in a dielectric matrix. Thus, a permittivity of the light-emitting layer 23 may be increased. Accordingly, a dielectric layer may be omitted.

As explained in the above, a graphene quantum dot composite according to the present invention may be applied for an ACPEL.

However, embodiments of the present invention are not limited thereto, and the graphene quantum dot composite may be applied for an AC thin film electroluminescent device (ACTFEL), a low-field electroluminescent device including a light-emitting diodes or the like.

Illumination Device

Figure 4:
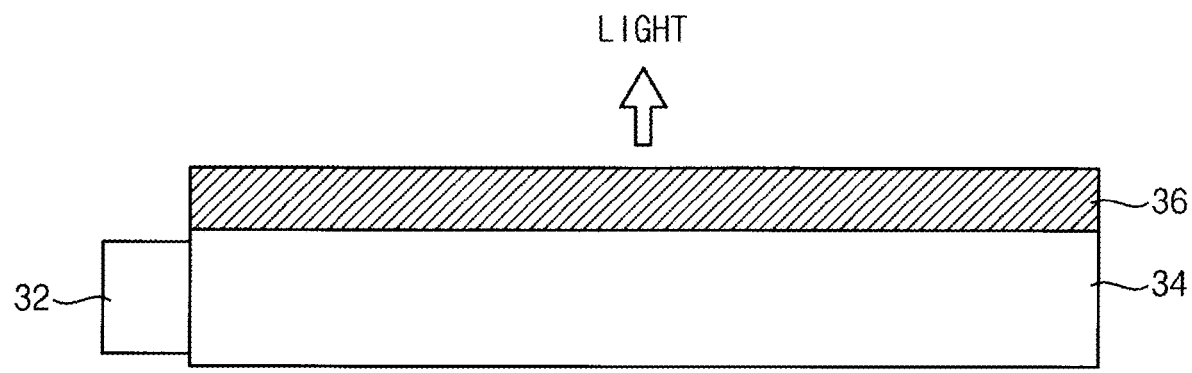
FIG. 4 is a cross-sectional view illustrating an illumination device according to an embodiment of the present invention.

FIG. 4 is a cross-sectional view illustrating an illumination device according to an embodiment of the present invention.

In an embodiment, an illumination device may include a light source 32, a light-guiding member 34 and a color-converting member 36.

In an embodiment, the light-guiding member 34 may have a plate shape. The light source 32 may be disposed on a side of the light-guiding member 34.

The light source 32 generates a light to provide the light to the light-guiding member 34. For example, the light source 32 may include a light-emitting diodes, and may generate a blue light.

The light-guiding member 34 may guide the light provided by the light source 32 toward the color-converting member 36. Even though not illustrated, a pattern or a groove may be formed at a lower surface of the light-guiding member 34 to scatter a light incident thereon. Furthermore, a reflective sheet may be disposed on the lower surface of the light-guiding member 34 to reflect a light incident thereon.

The light-guiding member 34 may include a material having a high transmittance in a visible ray range. For example, the light-guiding member 34 may include polymethylmethacrylate (PMMA).

The color-converting member 36 may be disposed on an upper surface of the light-guiding member 34. The color-converting member 36 may contact or may be spaced apart from the upper surface of the light-guiding member 34. For example, the color-converting member 36 may have a film shape or a sheet shape.

In an embodiment, the color-converting member 36 may include a graphene quantum dot composite. The graphene quantum dot composite may include a graphene quantum dot inserted in a dielectric matrix. The graphene quantum dot composite is same as that previously explained in the above. Thus, further explanation will be omitted.

In an embodiment, the graphene quantum dot composite may have a powder shape, which is dispersed in the color-converting member 36. For example, the color-converting member 36 may further include a binder resin. For example, the binder resin may include polyethylene terephthalate (PET), PMMA, polycarbonate (PC), triacetate cellulose (TAC) or a combination thereof.

As explained in the above, a graphene quantum dot composite according to an embodiment of the present invention may be applied for a color-converting member, an illumination device including the color-converting member, a display device including the illumination device or the like as well as an electroluminescent device.

Hereinafter, effects of the present invention will be explained with reference to specific experiments and Examples.

SYNTHETIC EXAMPLE

Boric acid and urea were added to a water solution with a graphene quantum dot having a size of 5 nm, and then pre-heated at 55° C. for dissolution. Thereafter, a mixture solution was heat-treated by microwave to obtain a composite of the graphene quantum dot inserted into a BNO matrix. Samples, of which contents of a graphene quantum dot in the composite were 0.002, 0.004, 0.008, 0.015, 0.031, 0.06, 0.122, 0.243, 0.486 and 0.967 wt %, were obtained by adjusting contents of the boric acid and the urea.

Example 1—Manufacturing a Powder

A ball-milling process was performed for the graphene quantum dot composite with a condition of 2,000 rpm and 30 minutes to obtain a graphene quantum dot powder having an average particle size of about 20~30 μm.

Example 2—Manufacturing a Powder

A ball-milling process was performed for the graphene quantum dot composite with a condition of 500 rpm and 30 minutes to obtain a graphene quantum dot composite powder having an average particle size of about 100 μm.

Example 3—Manufacturing an Electroluminescent Device

Indium tin oxide (ITO) was coated with a thickness of 150 nm on a glass substrate to form a lower electrode. A surface resistance of the substrate with the ITO layer was about 20 Ω/sq. A paste including a cyano-based polymer having a high permittivity was coated on the lower electrode by using a screen printer to form a lower dielectric layer.

Thereafter, the graphene quantum dot composite powder of Example 1 (a content of graphene quantum dot: 0.06 wt %) was mixed with an EL binder (a binder with a high permittivity for an electroluminescent device) with a weight ratio of 3:7, and then stirred with 2,000 rpm for 5 minutes to obtain a uniformly dispersed paste. Thereafter, the paste was coated on the lower dielectric layer by using a screen printer to form a light-emitting layer.

A paste including $BaTiO_3$ was coated on the light-emitting layer to form an upper dielectric layer. An Ag paste was coated on the upper dielectric layer by using a screen printer to form an upper electrode.

The pastes were coated by using a hand screen printer, and heat treatment was performed at 140° C. for 30 minutes to remove a remaining solvent after the pastes were coated.

Comparative Example 1—Manufacturing an Electroluminescent Device

An electroluminescent device was manufacture by a same method as Example 3 except that a paste for forming a light-emitting layer included a BNO powder and an EL binder mixed with each other with a weight ratio of 3:7.

Comparative Example 2—Manufacturing an Electroluminescent Device

An electroluminescent device was manufacture by a same method as Example 3 except that a paste for forming a light-emitting layer included a pristine graphene quantum dot and an EL binder mixed with each other with a weight ratio of 3:7.

Figure 5:
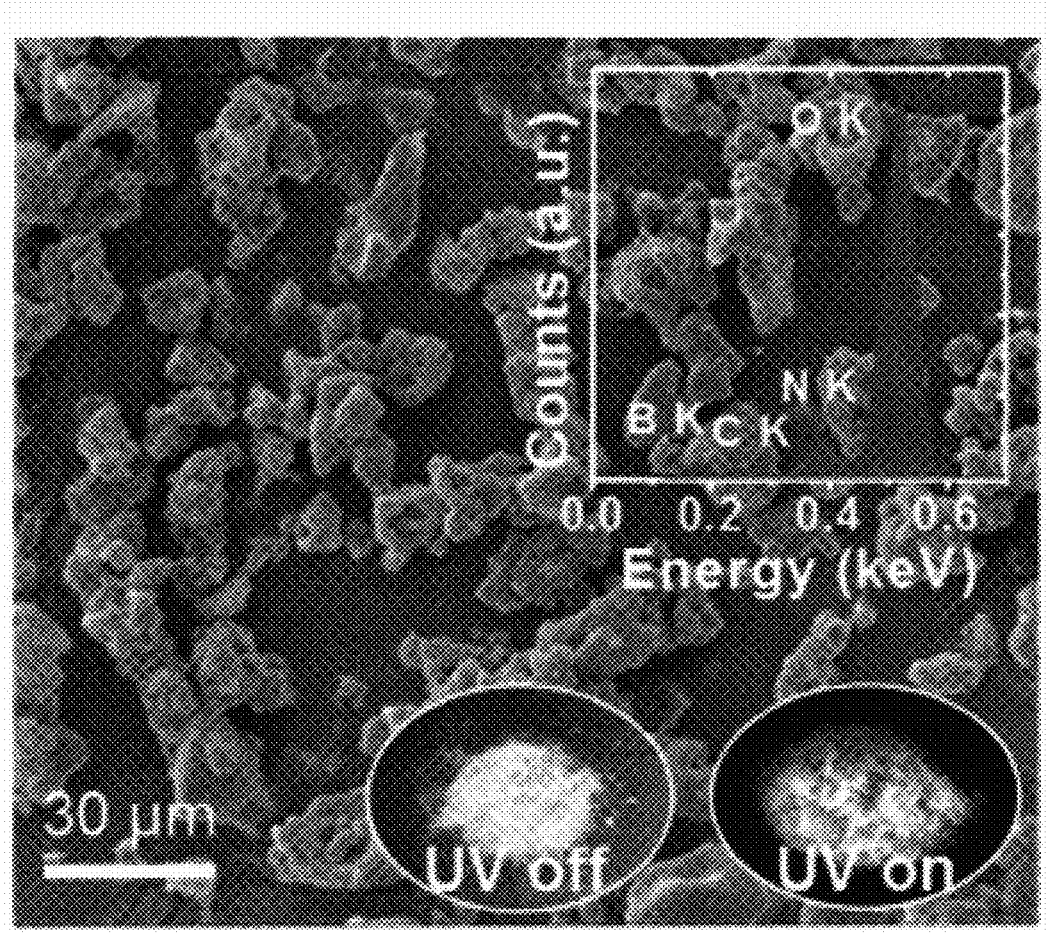
FIG. 5 shows a scanning electron microscopy (SEM) picture and energy dispersive X-ray spectroscopy (EDS) for the graphene quantum dot composite powder of Example 1.

FIG. 5 shows a scanning electron microscopy (SEM) picture and energy dispersive X-ray spectroscopy (EDS) for the graphene quantum dot composite powder of Example 1. Referring to FIG. 5, an average particle size of the graphene quantum dot composite powder was about 20~30 μm, and it can be noted from the EDS that the graphene quantum dot composite powder had an atomic composition of (B, 28.7 at %), (C, 4.8 at %), (N, 15.1 at %), (0, 51.4%).

Figure 6:
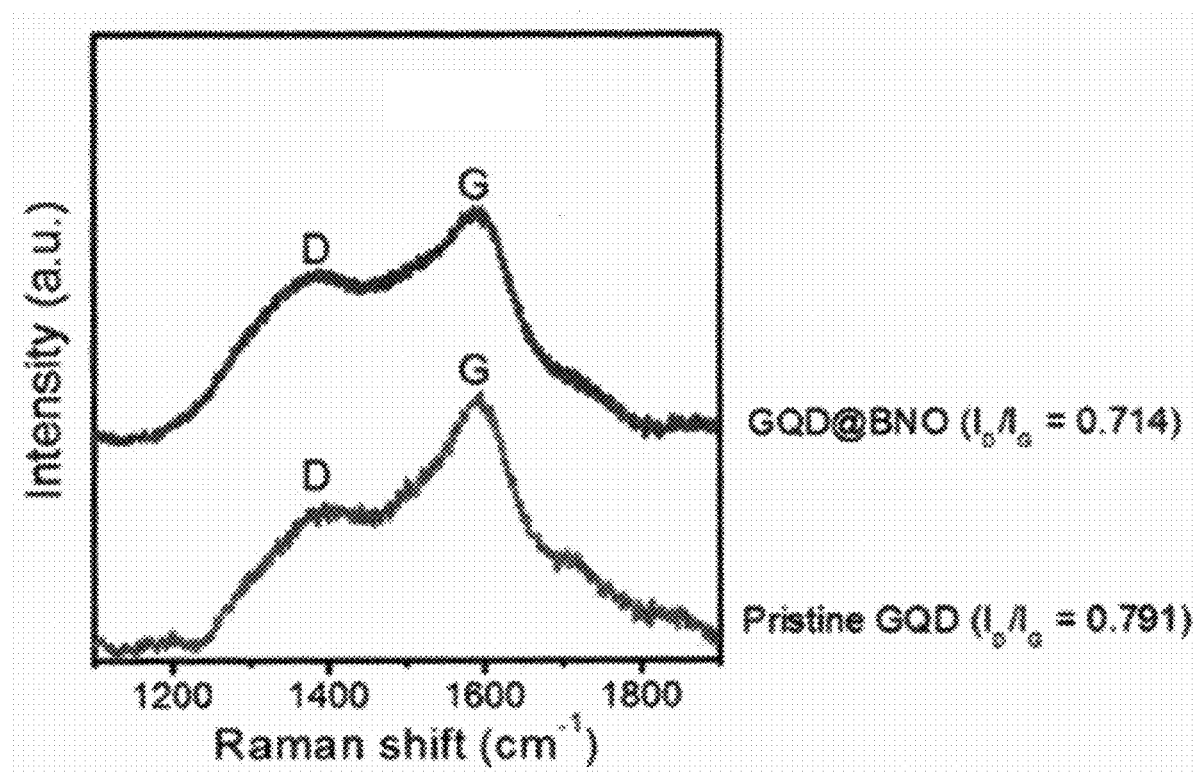
FIG. 6 is Raman spectrum for the graphene quantum dot composite of Example 1 (GQD@BNO, a content of graphene quantum dot: 0.24 wt %) and the pristine graphene quantum dot (pristine GQDs).

FIG. 6 shows Raman spectrum for the graphene quantum dot composite of Example 1 (GQD@BNO, a content of graphene quantum dot: 0.24 wt %) and the pristine graphene quantum dot (pristine GQDs). Referring to FIG. 6, D peak and G peak appeared near 1388.5 $cm^{-1}$ and 1595.5 $cm^{-1}$, respectively, similarly to the pristine graphene quantum dot, and a ratio of D to G ($I_D/I_G$) was 0.791. Thus, it can be noted that the graphene quantum dot was not either structurally deformed or decomposed in the process forming the graphene quantum dot composite.

Figure 7:
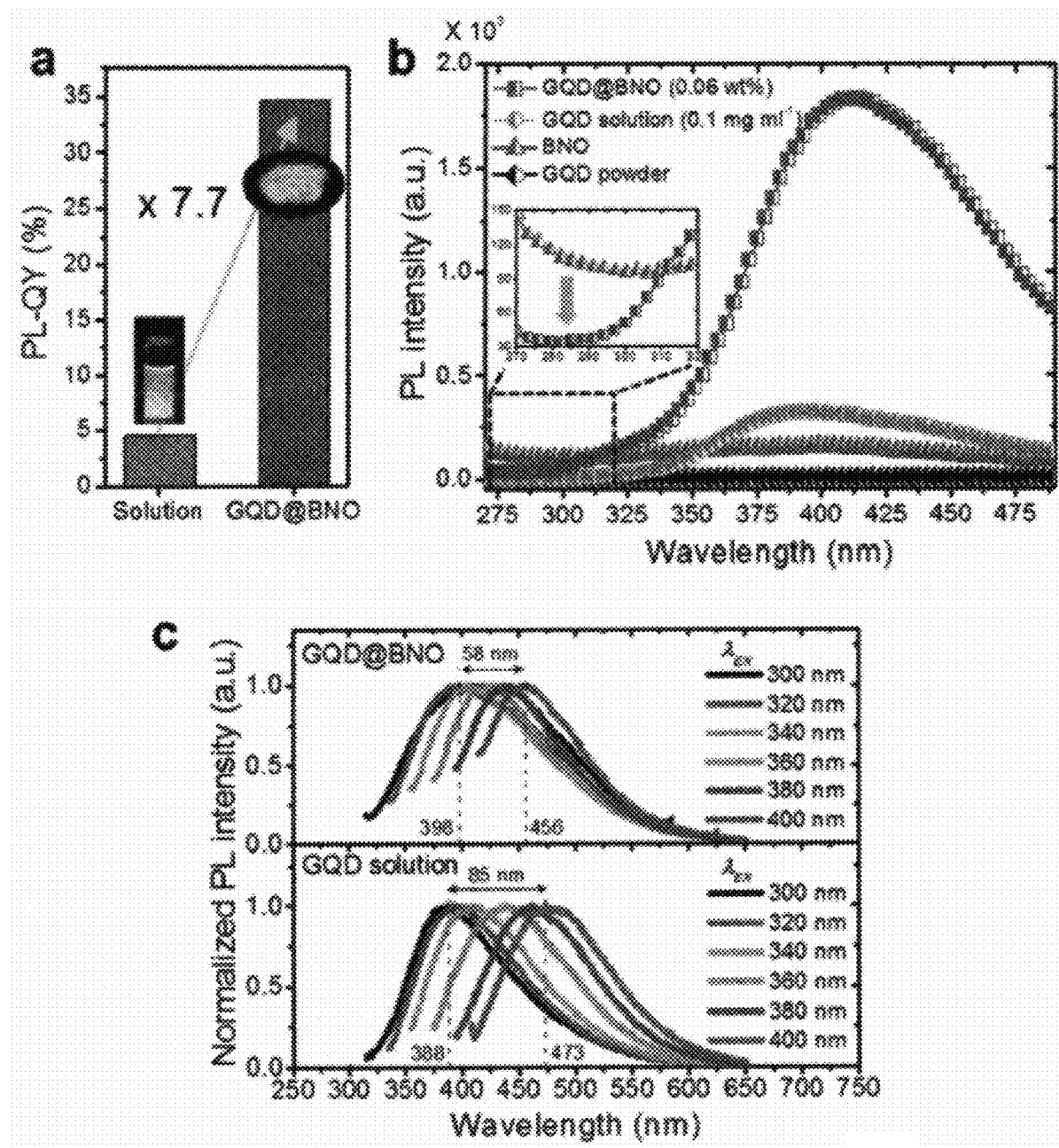
FIG. 7 shows (a) photoluminescence quantum yields (PLQY) for the graphene quantum dot composite of Example 1 (GQD@BNO, a content of graphene quantum dot: 0.06 wt %) and a graphene quantum dot solution (GQD solution, 0.1 mg/ml), (b) photoluminescence spectrums for the graphene quantum dot composite of Example 1 (GQD@BNO, a content of graphene quantum dot: 0.06 wt %), the graphene quantum dot solution (GQD solution), a matrix material powder (BNO) manufactured without a graphene quantum dot and a graphene quantum dot powder (GQD powder), and (c) normalized photo-luminescence spectrums according to excitation wavelengths for the graphene quantum dot composite of Example 1 (GQD@BNO, a content of graphene quantum dot: 0.06 wt %) and the graphene quantum dot solution (GQD solution).

FIG. 7 shows (a) PLQY for the graphene quantum dot composite of Example 1 (GQD@BNO, a content of graphene quantum dot: 0.06 wt %) and a graphene quantum dot solution (GQD solution, 0.1 mg/ml), (b) photo-luminescence spectrums for the graphene quantum dot composite of Example 1 (GQD@BNO, a content of graphene quantum dot: 0.06 wt %), the graphene quantum dot solution (GQD solution), a matrix material powder (BNO) manufactured without a graphene quantum dot and a graphene quantum dot powder (GQD powder), and (c) normalized PL spectra according to excitation wavelengths for the graphene quantum dot composite of Example 1 (GQD@BNO, a content of graphene quantum dot: 0.06 wt %) and the graphene quantum dot solution (GQD solution).

Referring to FIG. 7, it was measured that the graphene quantum dot composite had 8 times higher PLQY than that of the graphene quantum dot solution. The difference of PLQY is much larger than a difference expected by permittivity difference of surroundings. Thus, it can be noted that PLQY of the graphene quantum dot composite was further increased by fluorescence energy transfer to a graphene quantum dot by a BNO matrix.

Furthermore, it can be noted that dependency on an excitation wavelength for the PL spectrum of the graphene quantum dot composite was remarkably reduced by an effective dispersion stabilization of the BNO matrix with compared to the graphene quantum dot solution.

Figure 8:
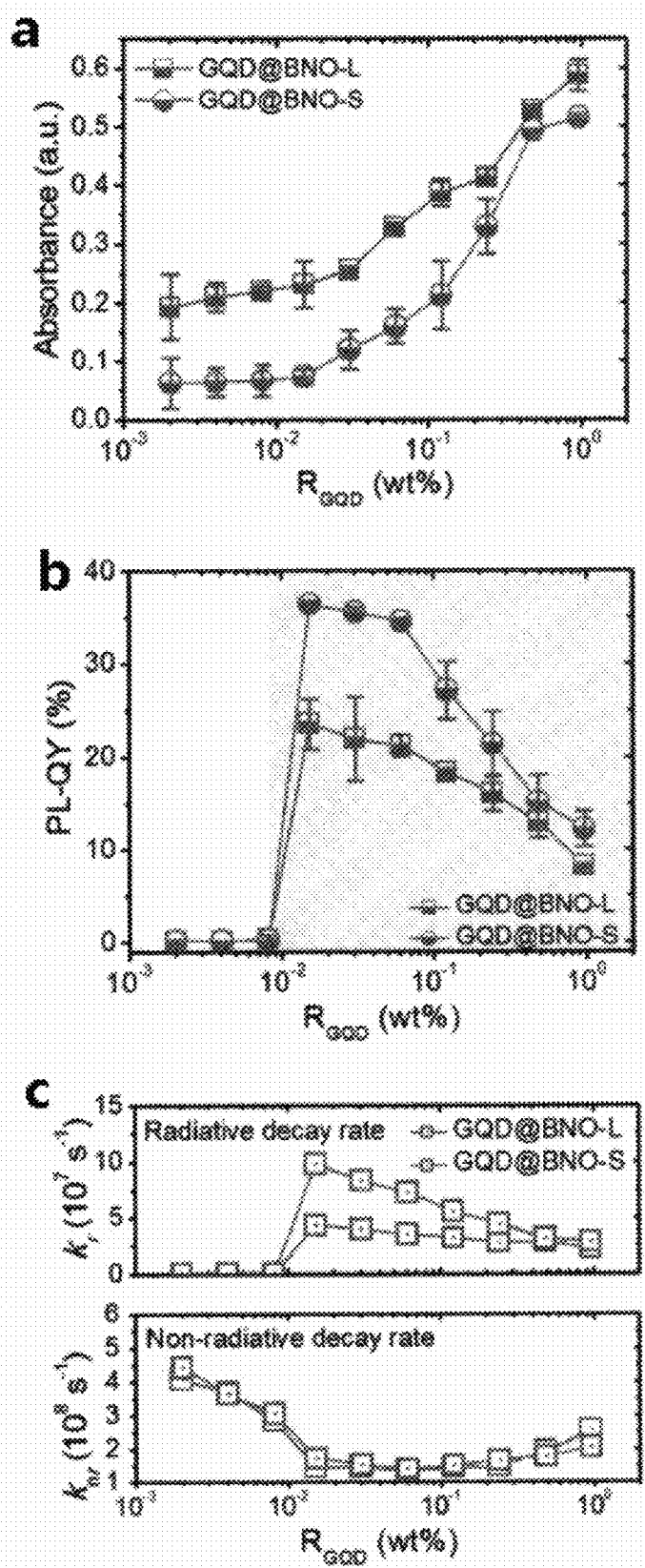
FIG. 8 shows (a) UV-vis absorbance, (b) absolute PLQY and (c) radiative/non-radiative decay rates for graphene quantum dot composites of Example 1 (GQD@BNO-S) and Example 2 (GQD@BNO-L) depending on graphene quantum dot contents (0, 0.002, 0.004, 0.008, 0.015, 0.031, 0.06, 0.122, 0.243, 0.486 and 0.967 wt %).

FIG. 8 shows (a) UV-vis absorbance, (b) absolute PLQY and (c) radiative/non-radiative decay rates for graphene quantum dot composites of Example 1 (GQD@BNO-S) and Example 2 (GQD@BNO-L) depending on graphene quantum dot contents (0, 0.002, 0.004, 0.008, 0.015, 0.031, 0.06, 0.122, 0.243, 0.486 and 0.967 wt %).

Referring to FIG. 8, it can be noted that morphology and photo-physical characteristics may be adjusted depending on a content of a graphene quantum dot in a matrix. Furthermore, when a content of a graphene quantum dot was less than 0.01 wt %, electroluminescence barely appeared, and when a content of a graphene quantum dot was more than 0.1 wt %, the PLQY was significantly reduced by aggregation. Furthermore, it can be noted that a PLQY and a decay rate may be changed depending on a powder size of a graphene quantum dot composite.

Figure 9:
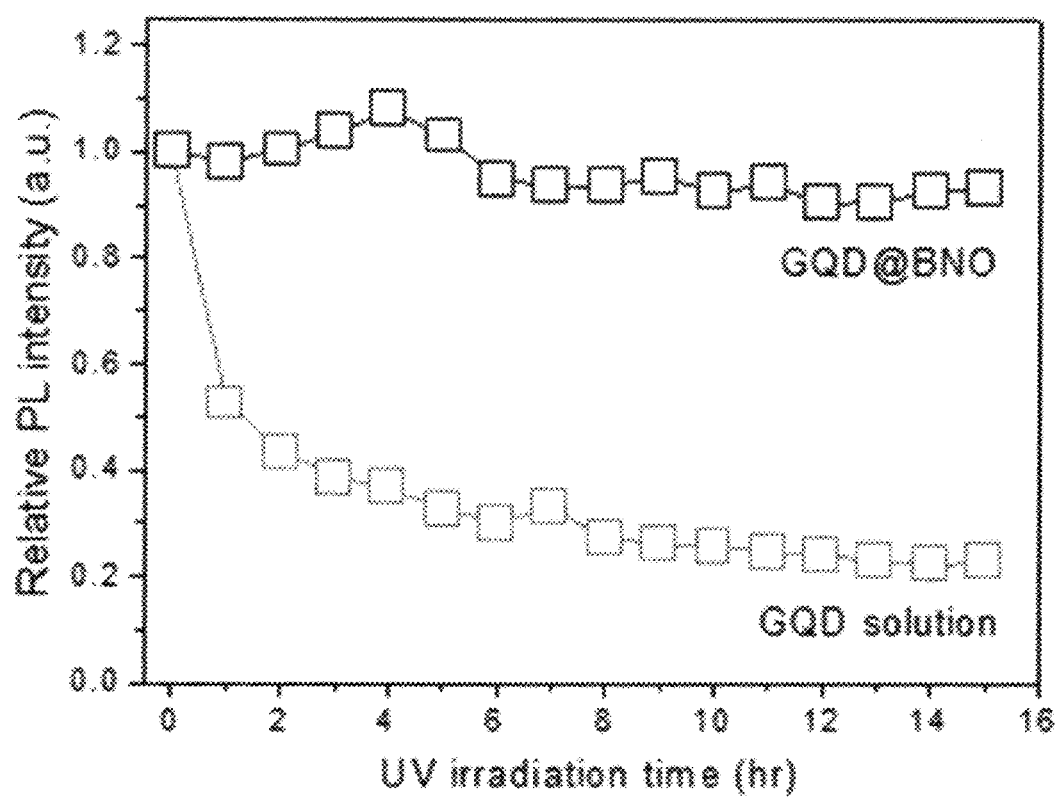
FIG. 9 is a graph showing relative photoluminescence intensities to UV exposure for the graphene quantum dot composite of Example 1 (GQD@BNO, a content of graphene quantum dot: 0.06 wt %) and a graphene quantum dot solution (GQD solution).

FIG. 9 shows relative PL intensities to UV exposure for the graphene quantum dot composite of Example 1 (GQD@BNO, a content of graphene quantum dot: 0.06 wt %) and a graphene quantum dot solution (GQD solution).

Referring to FIG. 9, it can be noted that a photostability of a graphene quantum dot was remarkably improved by using a BNO matrix material.

Evaluation for Electroluminescence and Dielectric Breakdown

Electroluminescent devices of Example 3, Comparative Example 1 and Comparative Example 2 were operated with 10 kHz and with a voltage sequentially increased by 10 V. Electroluminescence did not appear on the electroluminescent device of Comparative Example 1, and dielectric breakdown was caused when an applied voltage was about 300 V. Electroluminescence with a point shape appeared in some regions on the electroluminescent device of Comparative Example 2. However, electroluminescence did not entirely appear, and dielectric breakdown was caused when an applied voltage was about 500 V.

Figure 10:
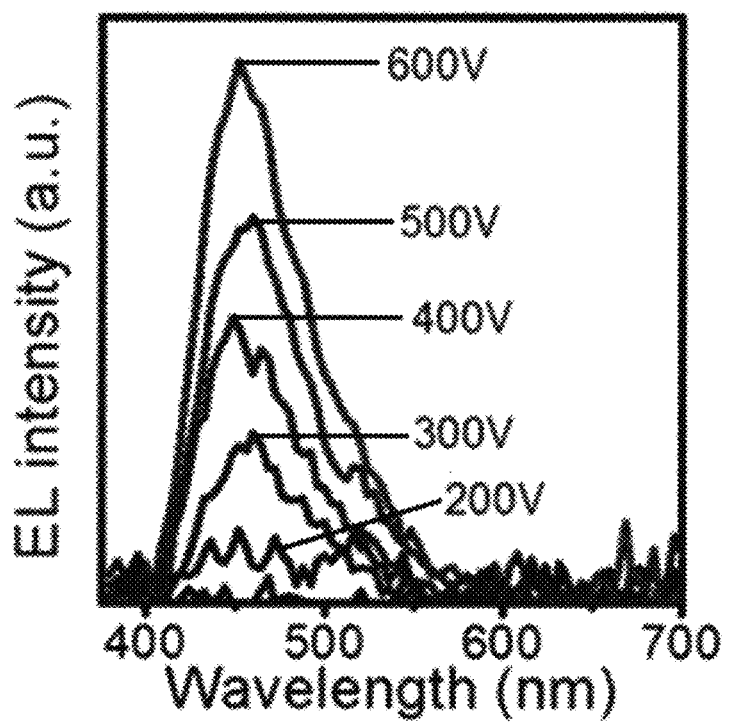
FIG. 10 is EL spectrum for the electroluminescent device of Example 3 depending on an applied voltage.

Electroluminescence was realized on the entire side of light-emitting layer on the electroluminescent device of Example 3 without dielectric breakdown until when an applied voltage was approximately 600 V. FIG. 10 shows a EL intensity for the electroluminescent device of Example 3 depending on an applied voltage thereto.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

ABILITY OF INDUSTRIAL UTILITY

A graphene quantum dot composite according to embodiments may be used for various electronic devices and optical devices such as an electroluminescent device, a color-converting film, an illumination device, a flexible display device or the like.

What is claimed is:

1. A graphene quantum dot composite comprising:
a dielectric matrix including a metal oxynitride; and
a graphene quantum dot dispersed in the dielectric matrix.

2. The graphene quantum dot composite of claim 1, wherein the metal oxynitride includes at least one selected from the group consisting of boron, aluminum, gold, gallium, yttrium, indium, scandium, cobalt, iridium, ruthenium, chromium, iron, zirconium, titanium, hafnium, silicon, tungsten, cerium, osmium, vanadium, niobium, tantalum and molybdenum.

3. The graphene quantum dot composite of claim 1, wherein the metal oxynitride includes boron oxynitride.

4. The graphene quantum dot composite of claim 1, wherein a content of the graphene quantum dot is 0.01 to 1 wt %.

5. The graphene quantum dot composite of claim 1, wherein the graphene quantum dot has a powder shape, and has an average particle size of 100 μm or less.

6. The graphene quantum dot composite of claim 1, wherein a distance between graphene quantum dots adjacent to each other in the graphene quantum dot composite is 4 nm or more.

7. The graphene quantum dot composite of claim 1, wherein the graphene quantum dot has a carbonyl group (C=O) or a hydroxyl group (—OH), which bonded to a surface thereof.

8. A method for manufacturing a graphene quantum dot composite, the method comprising:
preparing a mixture solution including a graphene quantum dot, a nitrogen-containing hydride and a metal hydroxide; and
reacting the nitrogen-containing hydride and the metal hydroxide with each other to form a dielectric matrix including a metal oxynitride and dispersing the graphene quantum dot therein.

9. The method of claim 8, wherein the nitrogen-containing hydride have at least one bond of C=O, C=S, C=Se and C=N.

10. The method of claim 9, wherein the nitrogen-containing hydride includes at least one selected from the group consisting of hydrogen cyanide, sodium cyanide, potassium cyanide, calcium cyanide, mercury cyanide, sodium nitroprussiate, acetonitrile, cyanogen chloride, cyanogen bromide, cyanogen fluoride, carbonyldiamine, carbonyldiimidazole, carbamoyl phosphate, cyanamide, sodium dicyanamide, malononitrile, valeronitrile, methyl isocyanate, methyl cyanoacrylate, methyl ferrocyanide, ethyl isocyanate, ethyl cyanoacrylate, ethyl ferrocyanide, propyl isocyanate, propyl cyanoacrylate, propyl ferrocyanide, butyl isocyanate, butyl cyanoacrylate, butyl ferrocyanide, pentyl isocyanate, pentyl cyanoacrylate, pentyl ferrocyanide, hexyl isocyanate, hexyl cyanoacrylate, hexyl ferrocyanide, butyl cyanoacetate, allyl cyanoacetate, 3-aminocrotononitrile, 2-methylbutyronitrile, 2-methoxyethyl cyanoacetate, thiosemicarbazide, dithiooxamide, thioacetamide, ethyl thiooxamate, 2-methyl-3-thiosemicarbazide, 4-methyl-3-thiosemicarbazide, 2-cyanothioacetamide, 4,4-dimethyl-3-thiosemicarbazide, 4-ethyl-3-thiosemicarbazide, 2-bromothiobenzamide, 3-bromothiobenzamide, 4-bromothiobenzamide, 4-chlorothiobenzamide, thiobenzamide, 4-methylbenzenethioamide, selenourea, selenoformamide, selenoacetamide, selenobenzamide and urea.

11. The method of claim 8, wherein the metal hydroxide includes at least one selected from the group consisting of boron hydroxide, aluminum hydroxide, gold hydroxide, gallium hydroxide, yttrium hydroxide, indium hydroxide, scandium hydroxide, cobalt hydroxide, iridium hydroxide, ruthenium hydroxide, chromium hydroxide, iron hydroxide, zirconium hydroxide, titanium hydroxide, hafnium hydroxide, silicon hydroxide, tungsten hydroxide, cerium hydroxide, osmium hydroxide, vanadium hydroxide, niobium hydroxide, tantalum hydroxide and molybdenum hydroxide.

12. The method of claim 8, wherein reacting the nitrogen-containing hydride and the metal hydroxide with each other is performed through electromagnetic wave treatment, heating, vacuum heating or drying.

13. The method of claim 8, further comprising grinding the graphene quantum dot composite to form a powder having an average particle size of 100 μm or less.

14. An electroluminescent device comprising:
a lower electrode;
an upper electrode spaced apart from the lower electrode; and
a light-emitting layer disposed between the lower electrode and the upper electrode and including a graphene quantum dot composite,
wherein the graphene quantum dot composite includes:
a dielectric matrix including a metal oxynitride; and
a graphene quantum dot dispersed in the dielectric matrix.

15. The electroluminescent device of claim 14, wherein the metal oxynitride includes boron oxynitride, and a distance between graphene quantum dots adjacent to each other in the graphene quantum dot composite is 4 nm or more.

16. The electroluminescent device of claim 14, further comprising a dielectric layer disposed between the light-emitting layer and at least one of the lower electrode and the upper electrode, and wherein the light-emitting layer is configured to emit a light by an alternating-current (AC) electric field.

* * * * *